United States Patent [19]
Cahill et al.

[11] Patent Number: 5,804,998
[45] Date of Patent: Sep. 8, 1998

[54] VOLTAGE UPWARDLY COMPLIANT CMOS OFF-CHIP DRIVER

[75] Inventors: Joseph James Cahill; Robert Russell Williams; Daniel Guy Young, all of Rochester, Minn.

[73] Assignee: International Business Machines Corporation, Armonk, N.Y.

[21] Appl. No.: 772,879

[22] Filed: Dec. 26, 1996

[51] Int. Cl.[6] ................................................ G11C 8/00
[52] U.S. Cl. ..................... 327/108; 327/112; 327/333; 326/68; 326/81; 326/83
[58] Field of Search .................................. 327/108, 112, 327/333, 437; 326/68, 81, 83

[56] References Cited

U.S. PATENT DOCUMENTS

| | | | |
|---|---|---|---|
| 4,709,162 | 11/1987 | Braceras et al. | 326/83 |
| 4,782,250 | 11/1988 | Adams et al. | 307/473 |
| 5,151,619 | 9/1992 | Austin et al. | 307/473 |
| 5,160,855 | 11/1992 | Dobberpuhl | 307/270 |
| 5,378,943 | 1/1995 | Dennard | 326/81 |
| 5,381,061 | 1/1995 | Davis | 326/57 |
| 5,396,128 | 3/1995 | Dunning et al. | 326/68 |
| 5,406,141 | 4/1995 | Yero et al. | 326/68 |
| 5,444,397 | 8/1995 | Wong et al. | 326/81 |
| 5,450,025 | 9/1995 | Shay | 326/81 |
| 5,467,031 | 11/1995 | Nguyen et al. | 326/81 |

*Primary Examiner*—Timothy P. Callahan
*Assistant Examiner*—Jung Ho Kim
*Attorney, Agent, or Firm*—Tyler Nasiedlak; Merchant, Gould, Smith, Edell, Welter & Schmidt

[57] ABSTRACT

The present invention is a driver circuit for interfacing electronic components which have different supply voltages. The driver circuit includes a source terminal for receiving a source voltage, an output terminal connected to an off-chip electronic component, and a pull up circuit disposed between the source and output terminals for providing a field effect controlled current path between the source terminal and the output terminal. The pull up circuit includes a first transistor in series with a second transistor, the second transistor providing overvoltage stress relief for the first transistor.

20 Claims, 1 Drawing Sheet

VOLTAGE UPWARDLY COMPLIANT CMOS OFF-CHIP DRIVER

FIELD OF THE INVENTION

The present invention relates generally to the field of computer chips, and more specifically to an off-chip driver circuit which allows computer chip sets with differing supply voltages to be compatible.

BACKGROUND OF THE INVENTION

Advances in complementary metal oxide semiconductor (CMOS) technology have caused the required power supply voltages for CMOS chips to drop from 5 volts to 3.6 volts to 3.3 volts to 2.5 volts. It is foreseeable that this trend will continue. The rapid change in this area requires that the new chip sets be compatible with other chip sets, which have different power supply voltages. Each technology needs to be compatible with at least the previous generation. For example, the 2.5 volt technology needs to interface to the 3.3 volt logic of the previous generation.

To accomplish this compatibility, circuitry is used to adjust the voltage level output from one generation of computer chip so that the output can serve as an input to a second generation of computer chip, where the two generations of computer chips have different supply voltages. This circuitry is usually in the form of an off-chip driver which drives the output voltage of a computer chip of one generation to the input of a computer chip of a second generation. The desired features of this circuitry include a minimum of voltage stress on the very thin gate dielectrics, and usually a reduction of drain-source voltage.

Contemporary systems used to accomplish this task have several serious drawbacks. First, the circuitry of these systems often allows backward current through the pull up transistor of the off-chip driver when the output of the driver is pulled less than a threshold voltage above the supply voltage (Vdd). Second, these systems typically allow unwanted current to flow in another situation when the output node is driven by an external driver with a voltage slightly less than Vdd. Third, the circuitry of these systems typically loads the output node of the off-chip driver with the capacitance of a floating n-well.

Thus, there is a need for improved computer chip compatibility. The present invention addresses this as well as other needs.

SUMMARY OF THE INVENTION

The present invention is a driver circuit for interfacing electronic components which have different supply voltages. The driver circuit includes a source terminal for receiving a source voltage, an output terminal connected to an off-chip electronic component, and a pull up circuit disposed between the source and output terminals for providing a field effect controlled current path between the source terminal and the output terminal. The pull up circuit includes a first transistor in series with a second transistor, the second transistor providing overvoltage stress relief for the first transistor.

In a further embodiment of the invention, the pull up circuit further uses a pair of parallel pass transistors which provide a voltage bias to the gate of the second transistor of the pull up circuit, the first parallel pass transistor connected to the higher supply voltage, and the second parallel pass transistor connected to the lower supply voltage.

In a further embodiment of the invention, there is a well bias circuit for voltage biasing the parallel pass transistors.

The well bias circuit has a first biasing transistor whose gate is tied to a first supply voltage and whose drain is tied to a second supply voltage, and a second biasing transistor whose drain is tied to the first supply voltage and whose gate is tied to the second supply voltage.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE DRAWINGS

Figure 1:
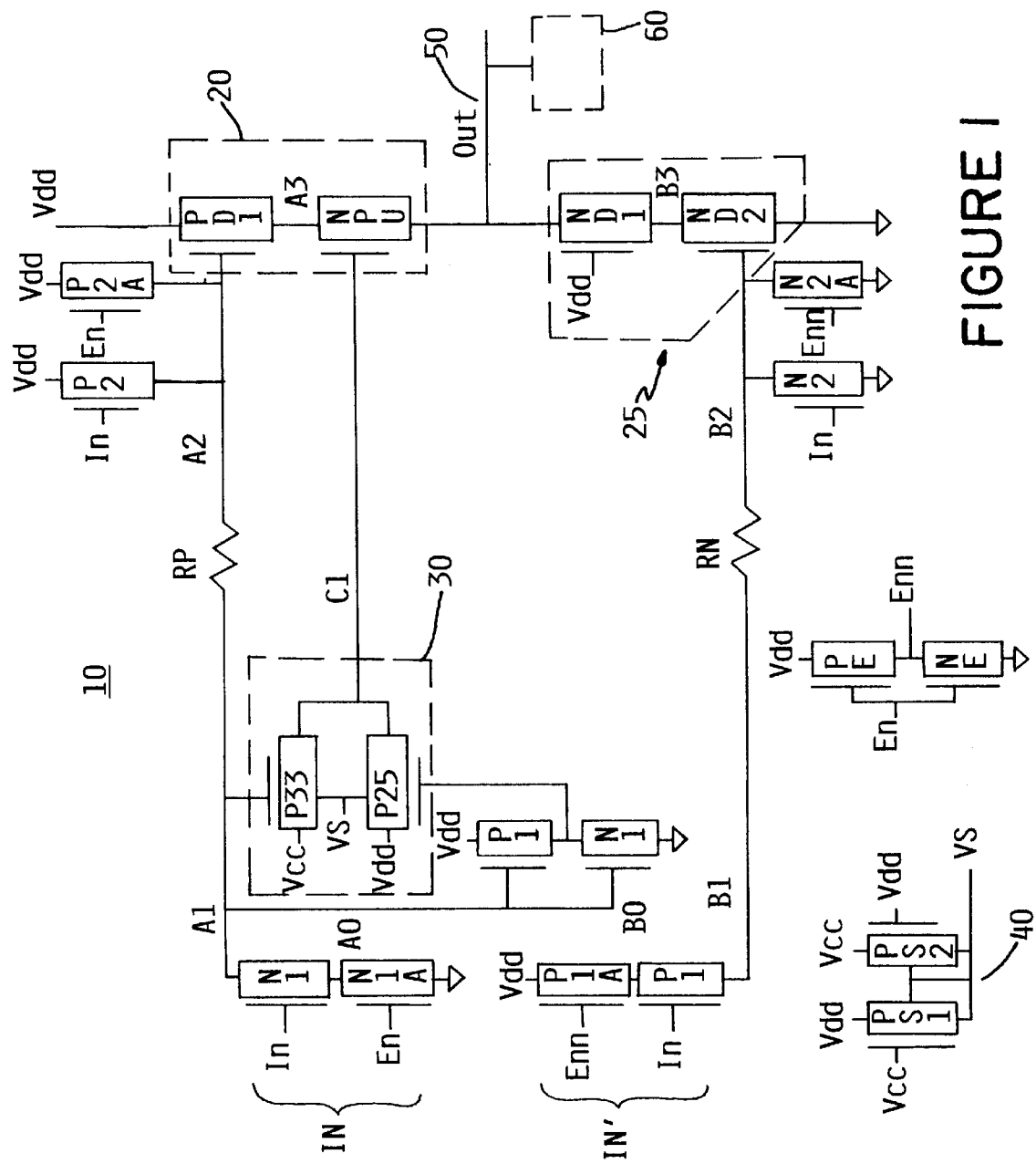
FIG. 1 is a circuit diagram illustrating an exemplary driver circuit in accordance with the principles of the present invention.

The present invention is directed to an apparatus for attaining computer chip compatibility between generations of chips with different supply voltages. FIG. 1 illustrates an exemplary CMOS off-chip driver 10 which interfaces a newer generation of chip, with a lower supply voltage, Vdd, for example, 2.5 volts, to an older generation of chip, with a higher supply voltage, Vcc, for example, 3.3 volts. The off-chip driver 10 reduces current leakage and stray capacitance.

The voltage upwardly compliant off-chip driver circuit 10 includes first and second input terminals IN and IN' connected to a pre-driver circuit and a pull up circuit 20 and a pull down circuit 25 serially arranged between voltage source Vdd and a reference potential, such as ground. A data output terminal out lies between the serially arranged pull up circuit 20 and pull down circuit 25.

The exemplary off-chip driver 10 illustrated in FIG. 1 and described herein is formed in a p-type semiconductor substrate with an n-well. It should be appreciated, however, that the CMOS off-chip driver circuit 10 may also be formed in an n-type semiconductor substrate with the well being of the p-well type with all polarities reversed. Furthermore, as is appreciated by those skilled in the art, the pull down circuit 25, including transistors ND1 and ND2, along with their predrive and compensation reduces stress and hot electron problems.

The pull up circuit 20 comprises a first transistor, e.g., PFET (p-channel field effect transistor) PD1, in series with a second transistor, e.g., NFET (n-channel field effect transistor) NPU. PFET PD1 and NFET NPU thus form an NFET/PFET stack with NFET NPU providing over voltage stress prevention to the oxide of the pull up PFET transistor PD1.

The driver circuit 10 may also include a biasing circuit 30 having a pair of parallel pass transistors 30, e.g., PFETs P33 and P25, which provide a bias voltage for the gate of the NFET NPU in the NFET/PFET stack of pull up circuit 20. As illustrated, one parallel pass PFET P33 may be connected to the higher supply voltage, and a second parallel pass PFET P25 may be connected to the lower supply voltage.

The off-chip driver circuit 10 may further include a well bias circuit 40, e.g., an n-well bias circuit, for voltage biasing the parallel pass transistors 30. The n-well bias circuit 40 may have a first biasing PFET PS1 whose gate is tied to supply voltage Vcc and whose drain is tied to supply voltage Vdd, and an oppositely-configured second biasing PFET PS2 whose drain is tied to supply voltage Vcc and whose gate is tied to supply voltage Vdd. This configuration is commonly known as cross-coupling.

Advantageously, the n-well of the pull up circuit 20 may remain firmly connected to Vdd, because of the series NFET transistor NPU of pull up circuit 20. In the other systems, there is a need to bias the n-well of the PFET pull up transistor to a voltage higher than Vdd at certain times to ensure proper functioning. Thus, off-chip driver 10 is simpler and decreases power consumption.

In operation, the gate C1 of NFET NPU is driven with Vcc (the supply of the older, higher-voltage logic) when off-chip driver 10 drives high, and Vdd (the current logic family's supply) otherwise. Thus, the present invention provides a reliable driver for interfacing generations of circuitry with different supply voltages, while at the same time solving the problems of current leakage and stray capacitance which are present in other off-chip drivers.

One example of the many advantages of the off-chip driver 10 occurs when the driver 10 is tristated. For example, assume node A1 is at 2.5 volts. Transistor P25 is thus closed (conducting from source to drain) thereby making node C1 2.5 volts. Transistor P33 may conduct slightly depending-on the PFET threshold voltage used. At the risk of increasing complexity to save a few microamps, this effect, if present, could however be eliminated using a conventional pass gate and half latch.

If another driver 60 pulls the output node 50 to Vcc (e.g., 3.3 volts), node A3 will be clamped to an NFET threshold below node C1, which is at 2.5 volts. The pull up PFET transistor PD1 thus acquires a high impedance (little or no conductance) state without any need to float its n-well. In addition, there is no need to provide means to pull transistor PD1 to Vcc at its gate A2. This decreases power consumption of the present invention relative to other off-chip driver circuits. Furthermore, in driver circuit 10, the gate A2 of transistor PD1 is typically not allowed to exceed Vdd relative to ground. This results in an undershoot condition voltage stress of only (Vdd+undershoot), typically, much less than other off-chip driver circuits, thereby keeping voltage stress to a minimum so as to ensure proper operation of the driver 10 and prevent damage to its components.

When the off-chip driver 10 is active and pulling high, there may typically be a need to charge both the pull up transistor PD1 and the series transistor NPU of pull up circuit 20. However, the relatively high conductance of the NFET results in the gate C1 of transistor NPU being held at Vcc through transistor P33. Thus, Transistor NPU transiently has Vcc on its gate, and should not be subject to hot electron degradation because it has very little drain-source voltage. In other words, as the node A1 falls, turning on PD1 through resistor RP, P33 is turned on and P25 is turned off. P33 raises node C1 from 2.5 V to 3.3 V. NPU is typically subject to hot electron degradation if it has a high drain-source voltage at the same time its gate-source voltage is at the device threshold. As used, since C1 is always at least 2.5 V above ground, NPU is always "ON" (while the output node is relatively low voltage) which keeps the drain-source voltage low.

In an alternative embodiment, the gate of transistor P33 could be connected to node A2 which would reduce the stress on transistor NPU's gate at a slight loss in performance.

As illustrated, transistors P33 and P25 of biasing circuit 30 may be PFETs with diffusions tied to different power supplies. The transistors P33 and P25 advantageously do not need power supply sequencing, however, because of the presence of the transistors PS1 and PS2. Transistors PS1 and PS2 have a cross-coupling configuration which charges the n-well of transistors P33 and P25 to the higher of the two supply voltages (Vcc) thereby ensuring back bias on all the diffusions in the n-well.

The foregoing description of the drawing of the present invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but rather extend to cover the full and fair scope of the claims set forth below.

What is claimed is:

1. A driver circuit for interfacing an electronic component having a higher supply voltage with an electronic component having a lower supply voltage, comprising:
   a source terminal for receiving a source voltage;
   an output terminal connected to an off-chip electronic component;
   a pull up circuit disposed between the source terminal and output terminal, the pull up circuit providing a field effect controlled current path between the source terminal and the output terminal, the pull up circuit including:
      a first transistor coupled to the source terminal; and
      a second transistor disposed between the first transistor and the output terminal, the second transistor providing overvoltage stress relief to the first transistor; and
   a biasing circuit coupled to the pull up circuit, the biasing circuit including a pair of parallel pass transistors providing a voltage bias to the gate of the second transistor of the pull up circuit.

2. The driver circuit of claim 1, wherein the first transistor comprises a p-channel field effect transistor (PFET) and the second transistor comprises an n-channel field effect transistor (NFET).

3. The driver circuit of claim 1, further including a pulldown circuit connected between the output terminal and a reference potential.

4. The driver circuit of claim 2, wherein the first and second transistors are of Complimentary Metal Oxide Semiconductor (CMOS) type.

5. The driver circuit of claim 1, wherein the source voltage comprises the lower supply voltage.

6. The driver circuit of claim 1, wherein one of the parallel pass transistors is connected to the higher supply voltage and the other one of the parallel pass transistors is connected to the lower supply voltage.

7. The driver circuit of claim 1, wherein the parallel pass transistors comprise PFET transistors.

8. The driver circuit of claim 1, further comprising a well bias circuit for voltage biasing the pair of parallel pass transistors, the well bias circuit comprising a cross-coupled pair of transistors.

9. The driver circuit of claim 8, wherein the cross-coupled pair of transistors include:
   a first biasing transistor having a gate connected to the higher supply voltage and a drain tied to the lower supply voltage; and
   a second biasing transistor having a gate connected to the lower supply voltage and a drain connected to the higher supply voltage.

10. The driver circuit of claim 9, wherein the first and second biasing transistors comprise PFET transistors.

11. A pull up circuit for use in a driver circuit for interfacing electronic components having different supply voltages, the driver circuit having a source terminal for receiving a source voltage and an output terminal coupled to an off-chip component, the pull up circuit comprising, a first transistor coupled to the source terminal;

a second transistor serially coupled with the first transistor, and disposed between the first transistor and the output terminal, the second transistor providing overvoltage stress relief to the first transistor; and a pair of parallel pass transistors providing a voltage bias to a gate of the second transistor, one of the parallel pass transistors being connected to a higher supply voltage, and a second parallel pass transistor being connected to a lower supply voltage.

12. The pull up circuit of claim 11, wherein the first transistor comprises a p-channel field effect transistor (PFET) and the second transistor comprises an n-channel field effect transistor (NFET).

13. The pull up circuit of claim 11, further comprising a well bias circuit coupled to the pair of parallel pass transistors for voltage biasing the pair of parallel pass transistors, the well bias circuit including a cross-coupled pair of transistors.

14. The pull up circuit of claim 13, wherein the cross-coupled pair of transistors includes:

a first biasing transistor having a gate connected to a higher supply voltage and a drain connected to a lower supply voltage; and a second biasing transistor having a gate connected to the lower supply voltage and a drain connected to the higher supply voltage.

15. The pull up circuit of claim 11, further comprising a well bias circuit coupled to the pull up circuit, the well bias circuit comprising:

a first biasing transistor having a gate connected to a higher supply voltage and a drain connected to a lower supply voltage; and a second biasing transistor having a gate connected to the lower supply voltage and a drain connected to the higher supply voltage.

16. A driver circuit for interfacing an electronic component having a higher supply voltage with an electronic component having a lower supply voltage, comprising:

a source terminal and an output terminal; and a pull up circuit disposed between the source terminal and output terminal, the pull up circuit including:

a first transistor of a first type coupled to the source terminal; and a second transistor of a second type different than the first type, disposed between the first transistor and the output terminal, for providing overvoltage stress relief to the first transistor, the second transistor having a gate coupled to a biasing circuit.

17. The driver circuit of claim 16, further comprising the biasing circuit, the biasing circuit including a pair of parallel pass transistors providing a voltage bias to the gate of the second transistor of the pull up circuit.

18. The driver circuit of claim 17, wherein one of the parallel pass transistors is connected to the higher supply voltage and the other one of the parallel pass transistors is connected to the lower supply voltage.

19. The driver circuit of claim 17, further comprising a well bias circuit for voltage biasing the pair of parallel pass transistors, the well bias circuit comprising a cross-coupled pair of transistors.

20. The driver circuit of claim 19, wherein the cross-coupled pair of transistors include:

a first biasing transistor having a gate connected to the higher supply voltage and a drain tied to the lower supply voltage; and a second biasing transistor having a gate connected to the lower supply voltage and a drain connected to the higher supply voltage.

\* \* \* \* \*